(12) United States Patent
Reith et al.

(10) Patent No.: US 6,232,154 B1
(45) Date of Patent: May 15, 2001

(54) OPTIMIZED DECOUPLING CAPACITOR USING LITHOGRAPHIC DUMMY FILLER

(75) Inventors: Armin M. Reith, Wappingers Falls; Louis Hsu; Henning Haffner, both of Fishkill; Gunther Lehmann, Poughkeepsie, all of NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/442,890

(22) Filed: Nov. 18, 1999

(51) Int. Cl.[7] .................................................. H01L 21/82
(52) U.S. Cl. ............................................. 438/129; 257/401
(58) Field of Search ................................ 438/238, 5, 284, 438/286, 110, 128, 129, 130; 716/2, 5, 9, 21, 8; 257/207, 401, 296, 379, 390, 532, 773; 364/488, 491

(56) References Cited

U.S. PATENT DOCUMENTS 5,361,234 * 11/1994 Iwasa ................................ 365/210
5,998,846 * 12/1999 Jan et al. ........................... 257/401

* cited by examiner

Primary Examiner—Matthew Smith
Assistant Examiner—Calvin Lee
(74) Attorney, Agent, or Firm—Stanton C. Braden

(57) ABSTRACT

A method to optimize the size and filling of decoupling capacitors for very large scale integrated circuits (VLSI) using existing lithographic fillers. The method combines the automatic or manual generation of lithographic fill patterns with the forming of the capacitors. According to the method, when the chip layout is about to be finished, all remaining empty space on the chip gets identified by a layout tool. Then, the closest power-supply nets get extracted. All power supplies and their combinations are sorted in a connection table which determines the appropriate types of capacitances once the power-supply nets closest to the empty spaces extracted from the layout. The empty spaces are then assigned appropriate decoupling capacitances. Decoupling capacitors generated by the method are suitable for VLSI power supplies for noise reduction.

12 Claims, 8 Drawing Sheets

FIG. 7A
FIG. 7B
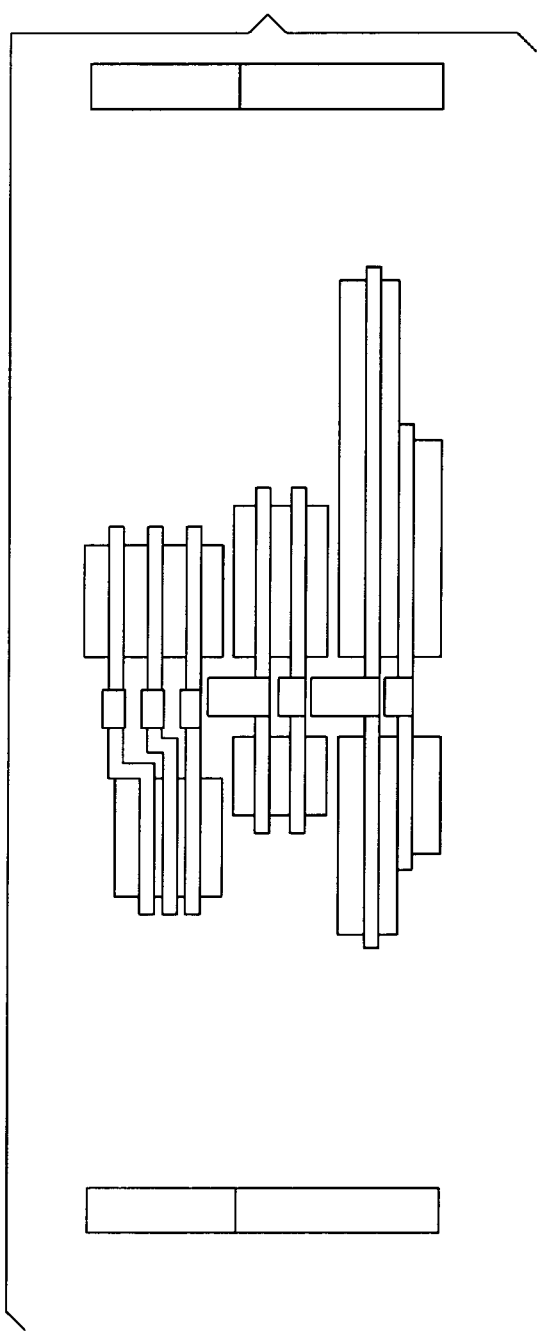
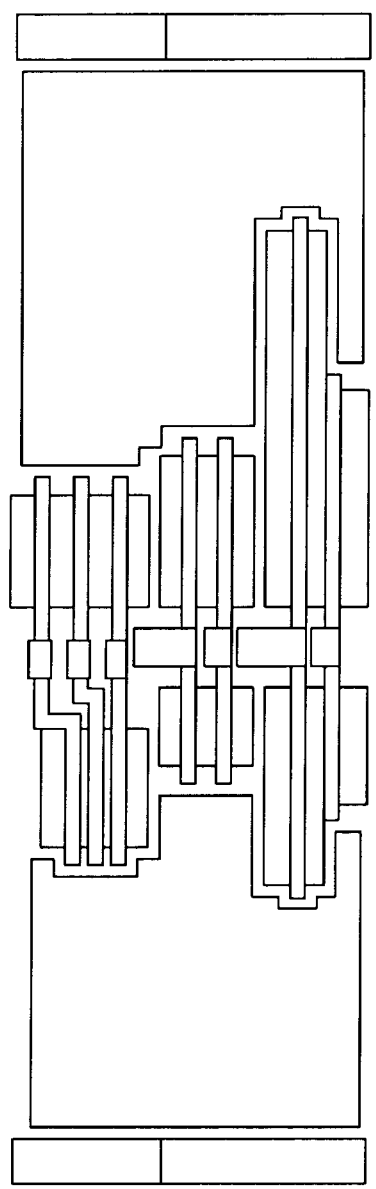

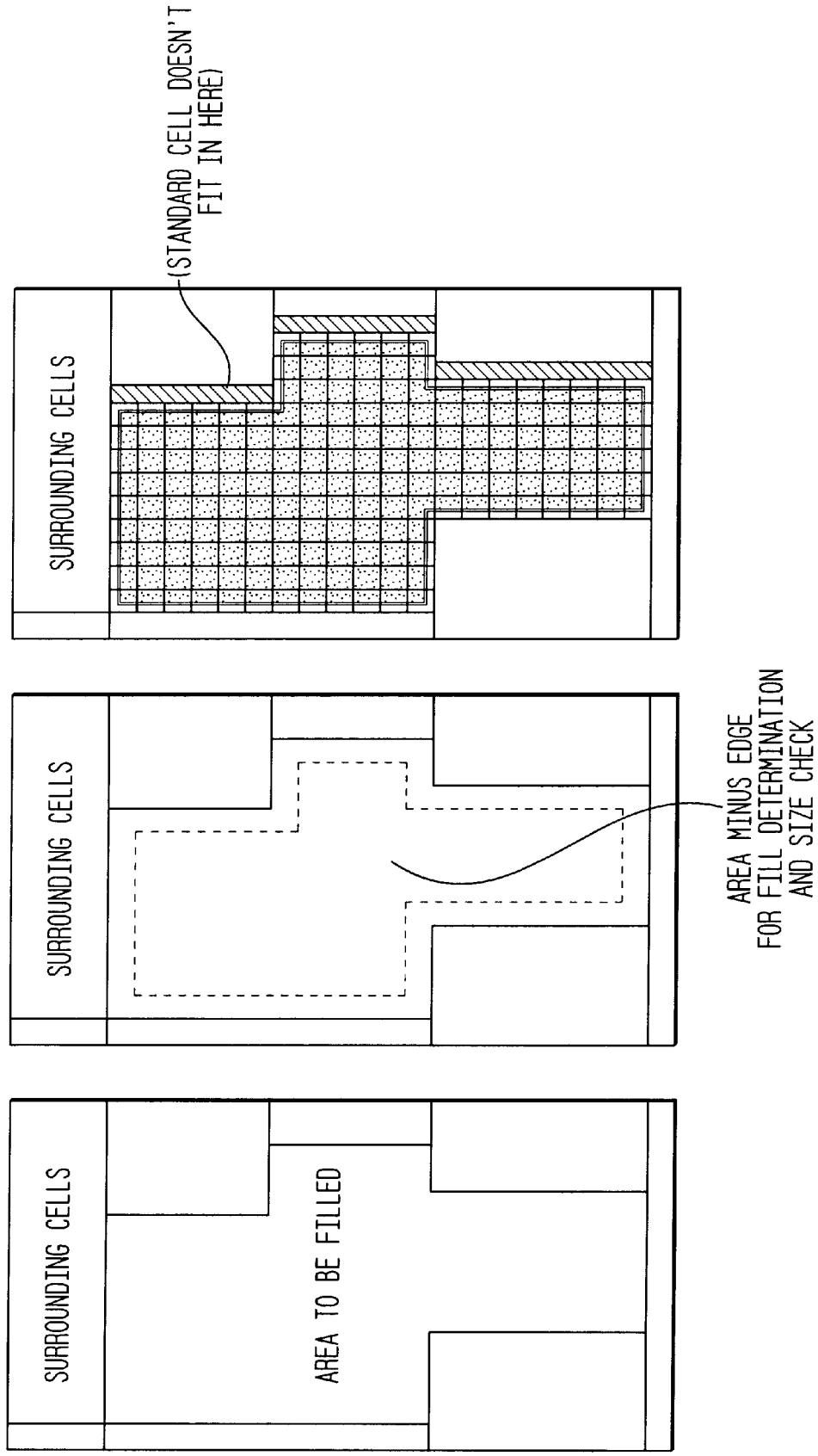

OPTIMIZED DECOUPLING CAPACITOR USING LITHOGRAPHIC DUMMY FILLER

CROSS-REFERENCE TO RELATED APPLICATION

This application is related to commonly assigned US patent application entitled: Metal Oxide Semiconductor Capacitor Utilizing Dummy Lithographic Patterns, application Ser. No. 09/224,767 filed on Jan. 4, 1999, which is incorporated herein by reference.

BACKGROUND OF THE INVENTION

1. Field of the Invention

The present invention generally relates to the formation of capacitors in semiconductor circuits, and more specifically to the utilization of unused "dummy" border areas of the DRAM arrays as decoupling capacitors and other useful structures in logic and memory arrays.

2. Description of the Related Art

In order to minimize noise effects, decoupling capacitors are often needed in very large scale integration (VLSI) circuits, to be attached in the various type of power supplies of logic and memory array circuits. Whether externally provided or internally generated, power supply voltage levels on advanced DRAM arrays, may typically vary from −0.5V to about 3.5V, which makes it difficult to implement sufficient decoupling capacitors for all types of power supplies. For example, voltages such as the boosted wordline voltage, are too high to be applied on a deep trench decoupling capacitor where reliability of the dielectric is a key concern. Moreover, such capacitors require a large amount of chip area which makes it difficult to find space on the chip to provide enough decoupling capacitors for each power supply.

VLSI circuits, especially memory arrays, have uniform repeatable shape patterns which are formed by lithographic techniques. However, due to different pattern densities, the patterns along the edges of the array are slightly different than the patterns not located along the edge (e.g., the "edge" effect). For example, elements such as via contacts that are located near the edge of the array often have patterns after exposure which are smaller than those located in the middle of the array due to uneven pattern density.

To overcome this problem, a few columns of "dummy" patterns are formed at the edge of the array. Therefore, there are no active devices located at the edge of the array and all active devices will have uniformly-patterned shapes. The dummy patterns formed along the edge of the array are normally tied to a certain voltage level (e.g., GND/Vdd) and are not used. For large arrays, the area wasted by dummy patterns can be significant.

The invention utilizes the otherwise wasted areas to simultaneously satisfy the uniform pattern density for better lithographic patterning and optimize the size and filling of the decoupling capacitors regardless of different power supplies, which in turn increases the overall effective utilization of the chip.

SUMMARY OF THE INVENTION

The present invention addresses the above problem with a method comprising the acts of performing a partial topographical layout of a semiconductor chip, the partial topographical layout including a plurality of power-supply nets; identifying an area not occupied by the partial topographical layout; selecting a power-supply net in the plurality of power-supply nets, depending on a spacial relationship between the plurality of power-supply nets and the area; augmenting the partial topographical layout, by assigning a capacitor to the area and making a connection between the selected power-supply net and the capacitor.

BRIEF DESCRIPTION OF THE DRAWINGS

The foregoing and other objects and advantages will be better understood from the following detailed description of preferred embodiments of the invention with reference to the drawings, in which:

FIG. 7A is schematic diagram of a chip before fill generation;

FIG. 7B is a schematic diagram of a chip after fill generation;

FIG. 10 is a series of diagrams showing placement of DT library cells to achieve pattern filling and DT decoupling.

DETAILED DESCRIPTION OF THE PREFERRED EMBODIMENTS OF THE INVENTION

As mentioned above, it is common to form dummy patterns around the edge of a semiconductor chip array to avoid problems associated with the non-uniform patterns which form along the edges of an array. Conventional structures leave the dummy patterns unused. The preferred embodiments of the present invention take advantage of these unused portions of the chip by creating passive devices such as decoupling capacitors in the unused dummy patterns.

Before discussing preferred embodiments in detail, a general discussion of the usefulness of dummy filler lithography with respect to a DRAM chip will be presented.

In high density DRAM designs, a boosted wordline voltage is usually generated internally by a charge pump and regulated by a voltage regulator. A reservoir capacitor keeps the boosted level voltage relatively stable. During DRAM operations, such as reading or writing to or from a cell, the wordlines are accessed with a boosted voltage (Vpp). This voltage is normally much higher than the internal supply voltage (Vint). For example, for 1 Gb DRAM technology Vpp=3.3V, and Vint=2.1V. The boosted voltage is needed to enhance DRAM access time. Therefore, when wordlines are accessed, large amount of current is drawn from the Vpp supply. If the reservoir capacitor of Vpp is not large enough, a noise spike will be shown on the Vpp. The noise is not desirable and could result in a performance penalty, or worse, access failure.

Conventionally, the reservoir capacitor is formed with large metal oxide semiconductor (MOS) capacitors having MOS gates or active diffusion junctions. The reservoir capacitor requires a large surface area. If the dielectric quality is poor, then the Vpp voltage stress on the node of the capacitors could result in dielectric breakdown. Each wordline has its own drivers and the Vpp supply line links to devices of the wordline drivers. However, the conventional approaches of forming a reservoir capacitor are disadvantageous because such conventional large MOS capacitors require a large surface area.

Figure 1A:
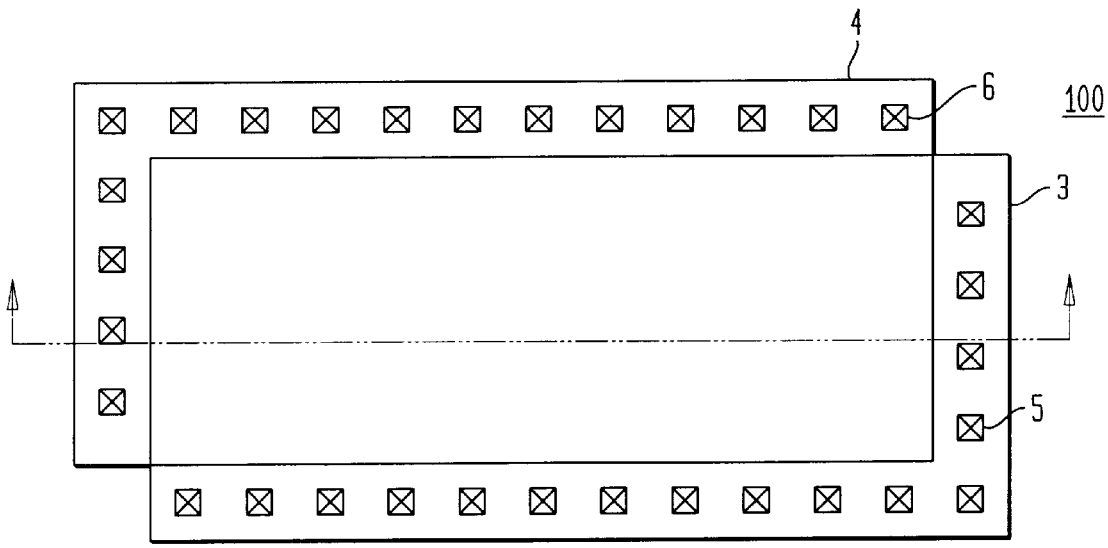
FIG. 1A is a schematic illustration of a top view of a conventional array showing portions of an array and array edges.
Figure 1B:
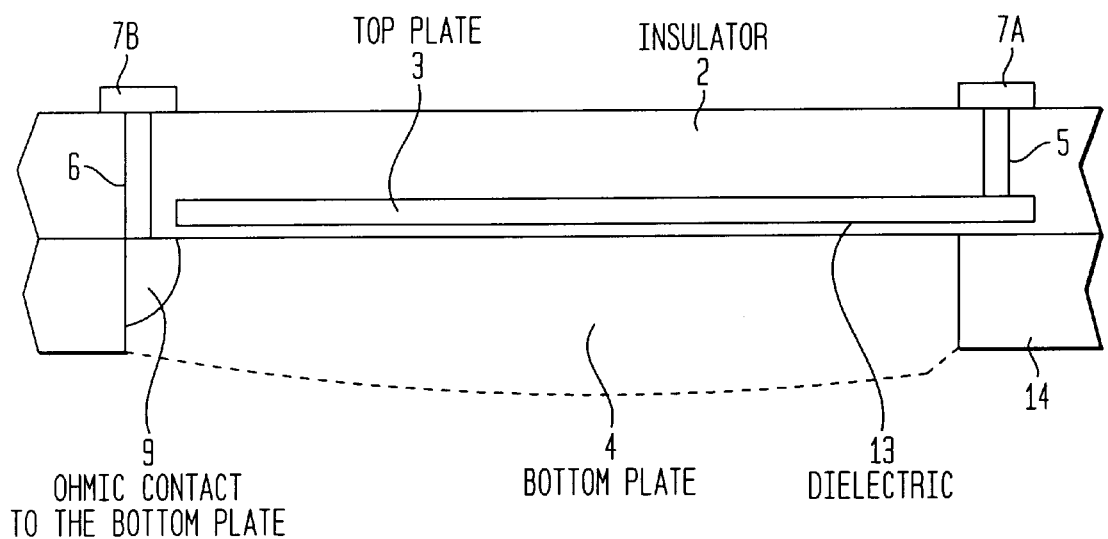
FIG. 1B is a schematic illustration of a cross-sectional view of the conventional array illustrated in FIG. 1A.

FIGS. 1A and 1B show a conventional gate oxide capacitor 100. A patterned diffusion layer 4 forms the bottom plate 4 of the capacitor 100 which is contacted by the first group of metal studs 6. The top plate 3 of the capacitor 100 can be doped with CVD polysilicon film and contacted by another group of metal studs 5. In between the two plates 3, 4, a gate dielectric 13 is provided, such as for example, a CVD oxide of nitride film. When the capacitor 100 is formed, it is passivated by an insulator layer 2. Ohmic contact to the bottom plate 4 is shown as 9. The studs 6, 5 are contacted by metal wiring 7A, 7B, respectively.

The modifications to this conventional design process are straight forward in that no processing steps are added to the conventional manufacturing process and no additional chip areas is used. Therefore, the additional capacitance comes at basically no additional cost while at the same time providing a substantial increase in overall performance.

The earlier mentioned prior art describes a method to convert some lithographic filler patterns around the memory array edges into useful decoupling capacitors. However, this invention is not limited only to dummy patterns around the memory array, but is also a method to create decoupling capacitors using all the dummy filler patterns on the chip. The method is equally applicable to converting such patterns to other useful semiconductor devices such as reservoir capacitors, resistors, diodes, inductors, etc.

Figure 2:
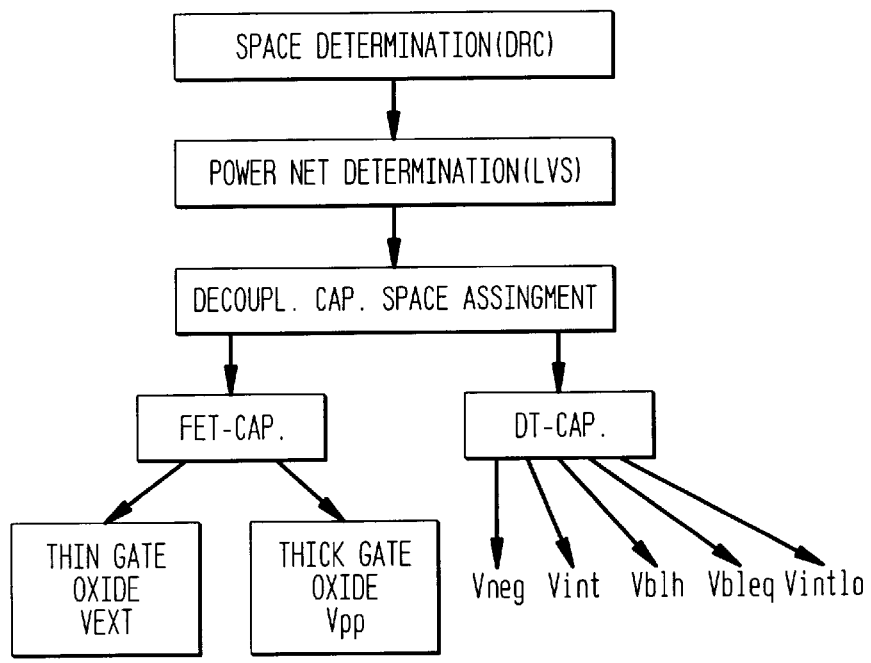
FIG. 2 is a flowchart of a method for generating a decoupling capacitor with lithography dummy filler according to preferred embodiment of the invention.

FIG. 2 shows a flow chart diagram of preferred embodiment of the present invention. When the chip layout is about to be finished, all remaining empty space on the chip gets identified by a layout tool (e.g., modified DesignGroundruleCheck or DRC). Then, the closest power-supply nets get extracted by using another layout checking tool (e.g., LayoutVersusSchematic-check or LVS).

All power-supplies and their combinations are sorted in a connection table which determines the appropriate type of capacitances once the power-supply nets closest to the empty spaces are extracted from the layout. Then, the empty spaces are assigned the appropriate decoupling capacitances.

For example, deep trench lithographic fill patterns can also be used to form decoupling capacitors for lower voltage power supplies, including low-level internal voltage for data I/O or "Vintlo", bitline equalization level or "Vbleg", bitline high level or "Vblh", negative wordline or "Vneg", etc. For higher voltage level power supplies, gate filler or GC and diffusion filler AA could be combined to form plate or FET-capacitors, which can be made as a thin-gate oxide capacitor for external voltage supply or "Vext", or as a thickgate oxide capacitor for boosted wordline supply or "Vpp".

Thin-gate oxide mask technology can be implemented to generate thin gate oxide for Vext and the gate oxide mask for Vpp, since the Vpp level is much higher than the Vext level.

Figure 3:
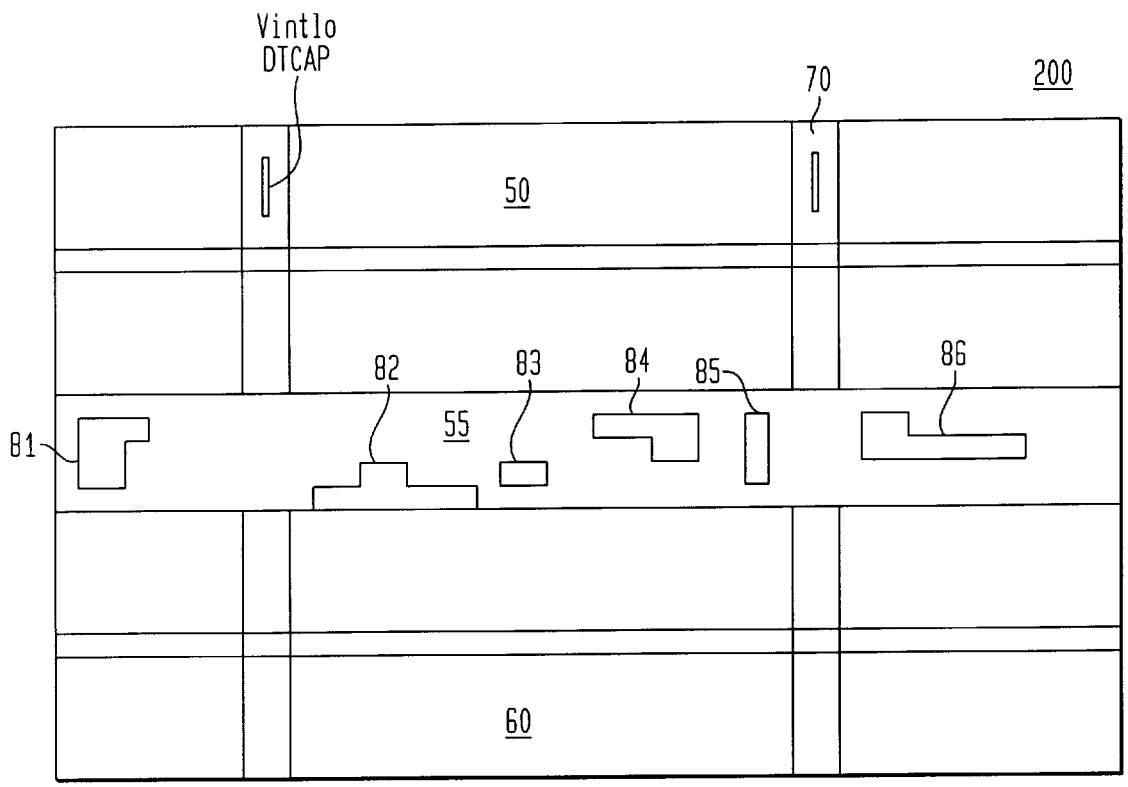
FIG. 3 is a schematic diagram of the final layout structure of decoupling capacitors according to preferred embodiment of the invention.

FIG. 3 shows the final decoupling capacitor layout structure formed according to preferred embodiment of the present invention on a semiconductor structure 200, such as a DRAM chip. In the spine area 55 of the DRAM chip, there are many irregular empty spaces 81, 82, 83, 84, 85, 86 where different kinds of decoupling capacitors for different power supplies can be automatically generated by a pattern generator tool.

According to the present this embodiment, lower voltage level power supplies are linked with a relatively large value of DT decoupling capacitor with a thinner node dielectric, while higher voltage level power supplies are linked with relatively smaller value of plate-type or FET decoupling capacitors with a thicker node dielectric. Therefore, the node dielectric breakdown on the decoupling capacitors can be avoided.

Figure 4:
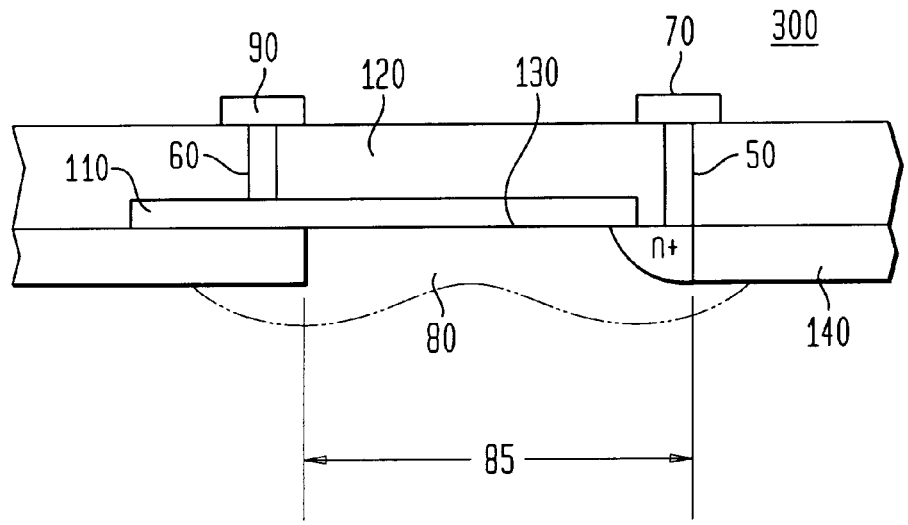
FIG. 4 is a top-view diagram of a dummy fill pattern which has been converted to a useful field effect transistor (FET) type decoupling capacitor according to preferred embodiment of the invention.

FIG. 4 shows a cross-sectional view of a plate-type or field effect transistor (FET) decoupling capacitor 300 which can be generated by a pattern generator tool. The bottom plate 80 is formed by diffusion inside an isolation opening 85. The isolation can be device shallow isolation 140 formed by active area (AA) patterning. The bottom plate is contacted by the first group of metal studs 50, which are later linked by metal wiring 70. The top plate 110 is formed by an FET device having a finger shaped gate pattern (GC), which is contacted by a second group of metal studs 60 and will be later linked by metal wire 90. A gate dielectric 130 is presented between the top plate 110 and the bottom plate 80 of the capacitor, which can be formed by oxidation of CVD film deposition.

Figure 5:
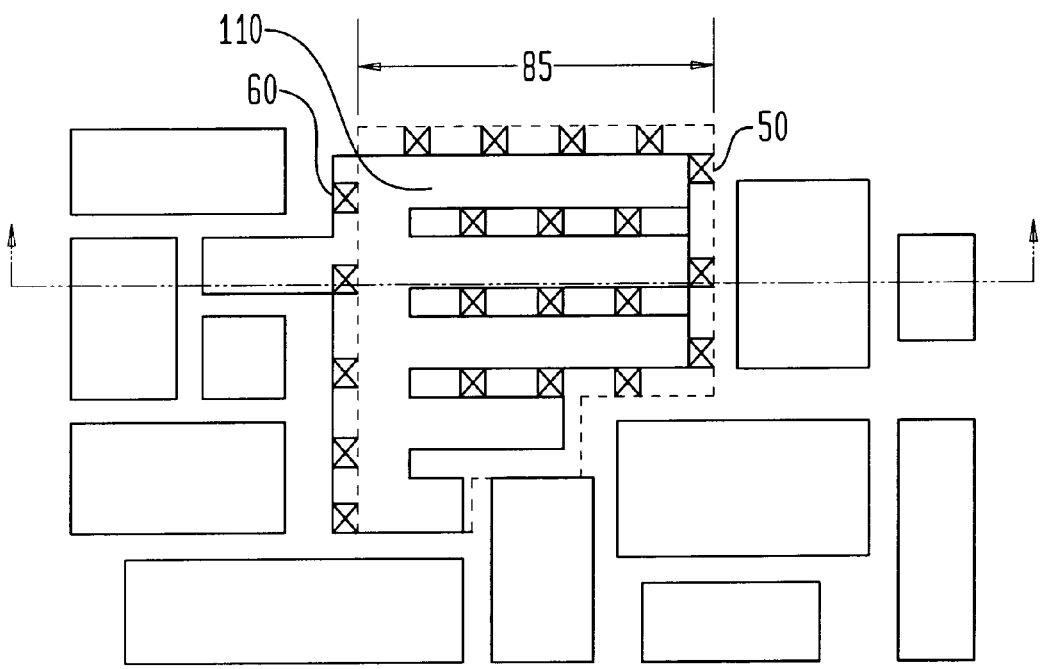
FIG. 5 is a cross-sectional diagram of a field effect transistor (FET) type decoupling capacitor according to preferred embodiment of the invention.

FIG. 5 shows an enclosed GC filler FET decoupling capacitor which can be generated by a pattern generator tool. Metal wiring 70, 90 discussed above with respect to FIG. 4 are not shown on FIG. 5.

Figure 6:
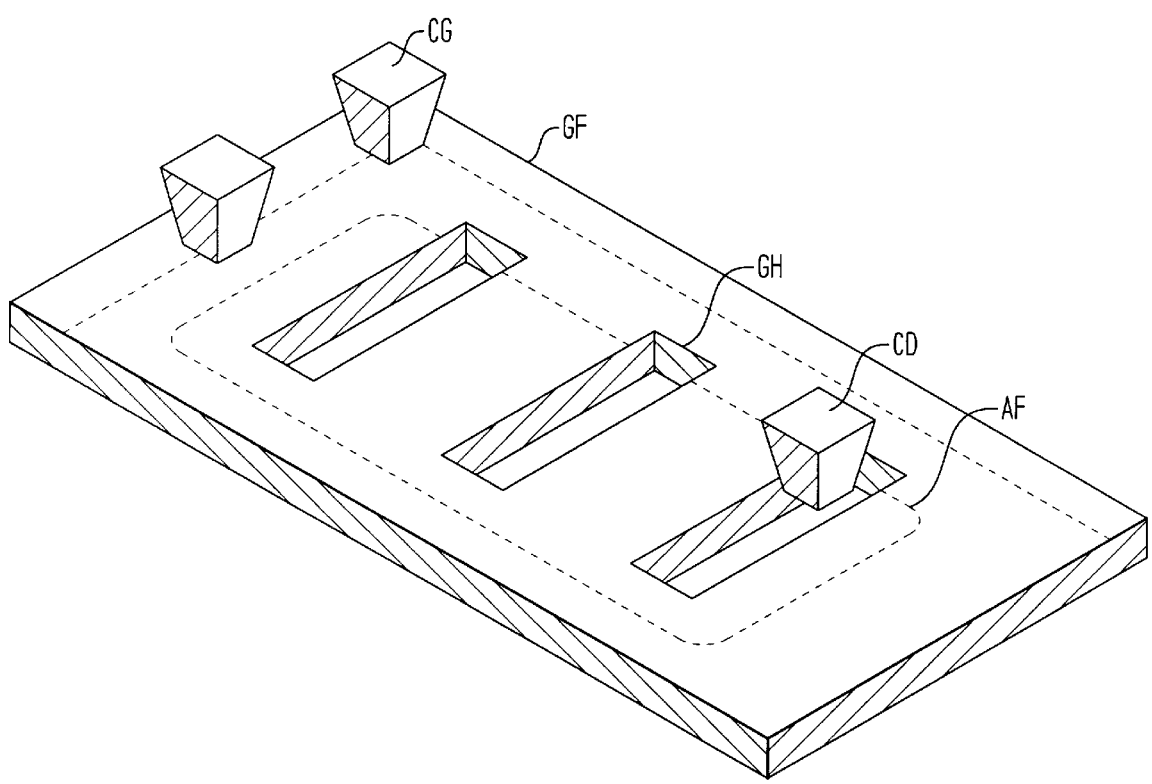
FIG. 6 is a three-dimensional representation of a field effect transistor (FET) type decoupling capacitor.

FIG. 6 shows a three-dimensional view of a polysilicon gate filler (GF) decoupling capacitor. Contact-to-gate (CG) contacts are placed on top of the GF layer, and contact-to-diffusion (CD) contacts are placed inside the active region filler (AF) through gate fill hole openings (GH) on the GF.

The following process is used to generate such decoupling capacitors, and would also satisfy the fill pattern density rule using a pattern generation tool, such as the IBM Niagra tool:
1) fill the empty space with GF (also called GC fill) shape but keep a certain distance form the surrounding GC and AA; 2) generate AF (also called AA fill) shape by shrinking the generated GF by a certain amount; 3) long bars out of the generated GF to meet the filler density requirement and the bars must be completely inside the AA shape; 4) contacts on the GF in the rim around the AF following certain rules so that GF can be contacted by a metal in a later design phase; 5) place contacts inside the bars cut out of the GF on the AF and following certain rules so that AF can be connected in a later design phase.

FIG. 7A shows a decoupling capacitor before automatic fill generation.

FIG. 7B shows a decoupling capacitor including automatically generated fill shapes.

Figure 8:
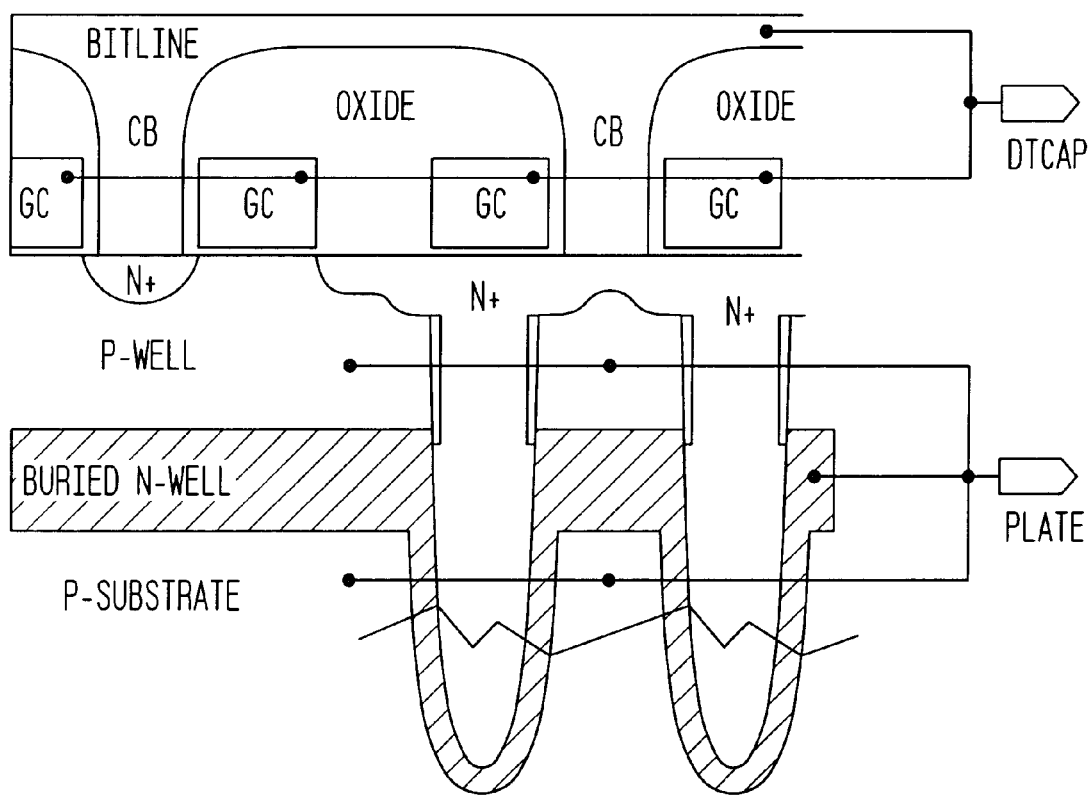
FIG. 8 is a cross-sectional diagram of a deep-trench capacitance with electrical connections.

A method of forming deep trench decoupling capacitors, hereinafter referred to as "DT decoupling capacitors"

according to preferred embodiment of the present invention will now be discussed with reference to FIG. 8, which shows a typical decoupling deep trench capacitance along with its electrical connections.

A deep trench capacitance normally comprises regular DRAM memory-cells in a completely or partly filled N+ diffusion areas. This more than usual filling with AA diffusion areas causes connections between the trenches and bitlines via connected N+ areas regardless of the GC polysilicon gate which usually would form a transfer device.

The deep trench pattern should be the same as in the arrays to provide an even structure for producing the best lithographic patterning results. AA and GC should be patterned in a way identical to a normal active array in order to optimize the process. Because of process variations depending on the deep trench-array size, the deep trenches should be about a few thousands in number minimum, (e.g., more or equal to 2500 deep trenches, including dummy deep trenches) in order to improve reliability.

The node of the deep trench capacitor (or "DTCAP" pin) must be connected to a more positive voltage, such as Vblh, Vint, etc., than its plate (or "PLATE" pin), but not higher than a reasonable level to minimize dielectric breakdown and leakage. The plate of the DT capacitor as well as the P-substrate and P-well are all connected to ground.

Figure 9A:
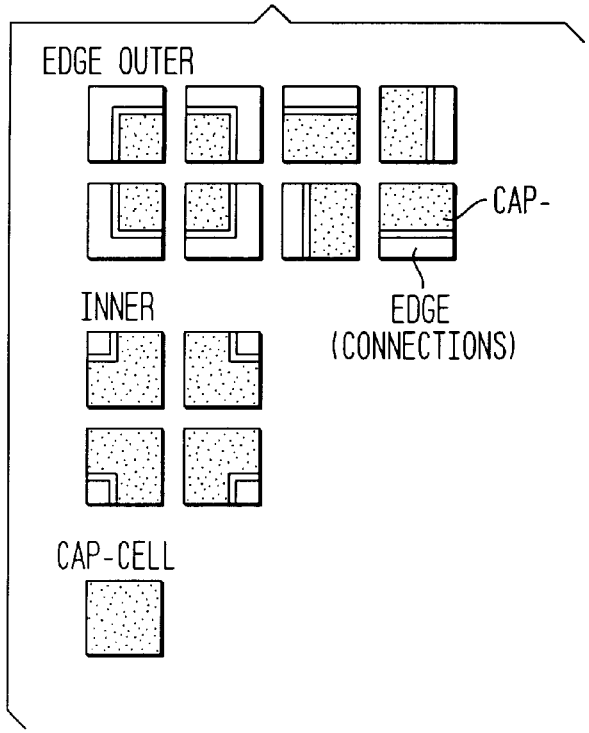
FIG. 9A is a schematic diagram of a deep-trench capacitance cell library.
Figure 9B:
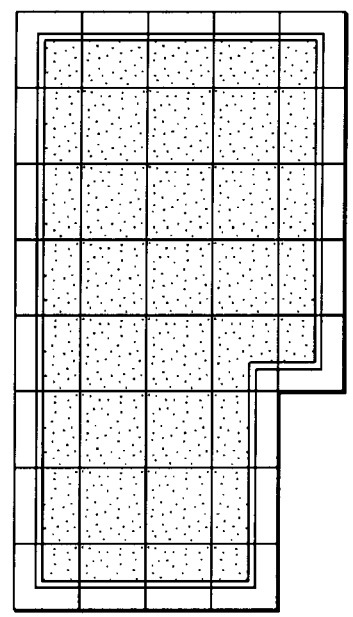
FIG. 9B is a schematic diagram of an example of a cell arrangement.

Turning to FIGS. 9A, 9B and 10, the DTCAP can be built by a filling process that uses a library of cells consisting of array edge cells and array capacitor cells.

As shown in FIG. 9A, the CAP area should be shrunken by the necessary edge area in order to determine the total available capacitance area and the proper fill pattern available for the cells. When the fill pattern gets calculated, it has to be checked to see whether the capacitance is too small, which means if not enough deep trench-shapes are used, an insufficient reliability assurance could result. Or, on the other hand, if the capacitance is too big, there is a higher failure possibility due to pin-hole related capacitor short. In the first case, the area then should get the normal fill without generating a capacitance or only a FET decoupling capacitance. In the second case, the capacitance has to be made smaller or get spilt into two smaller capacitances. If the capacitance check passes, the area gets filled as calculated.

FIG. 9B shows an example of a cell library.

As shown in FIG. 10, it is possible that the standard fill cells of the library may not use all available space. The smaller the library cell size, the better the fill, but the longer the calculation time. Thus, an appropriate size should be found.

The fill connections for the wiring can be made automatically by the fill pattern generator, which determines the nearest wiring point for making an appropriate connection to the proper decoupling capacitor cell. In the alternate, fill connections for the wiring can be made manually, in which case a technician determines the nearest wiring point for making an appropriate connection to the proper decoupling capacitor cell.

In summary, a preferred method includes modifying semiconductor lithographic fill patterns, determining residual space on the semiconductor circuit, determining the location of adjacent power nets on the semiconductor circuit, and assigning space for forming a proper type of decoupling capacitor on each adjacent power net. Modifying the fill patterns includes modifying polysilicon gate level lithographic fill patterns, filling a residual space with a polysilicon gate pattern; forming one or more openings inside the polysilicon gate pattern; forming contact patterns on the remaining polysilicon pattern; forming contact patterns on a diffusion region inside the openings; connecting the contacts on the remaining poly silicon pattern to form a plate node; connecting the contacts on a diffusion region to form a ground node; and connecting the plate node to the power net.

Another aspect of the preferred method includes forming plate-type decoupling capacitors in a semiconductor circuit by modifying polysilicon gate level lithographic fill patterns. The method includes using a first algorithm to determine residual space on the semiconductor circuit, using a second algorithm to determine the location of one or more higher-level power net on the semiconductor circuit, and assigning space for forming the capacitors using the lithographic fill patterns. The dielectric film of the polysilicon gate capacitor is inherently thicker than that of the trench capacitor, and therefore can sustain higher-level power stress.

Another aspect of the preferred method includes for forming deep-trench type decoupling capacitors in a semiconductor circuit by modifying polysilicon gate level lithographic fill patterns, by using a first algorithm to determine residual space on the semiconductor circuit, using a second algorithm to determine the location of one or more lower-level power net on the semiconductor circuit, and assigning space for forming the capacitors using the lithographic fill patterns.

A decoupling capacitor may be plate type or deep-trench type.

Another aspect of the preferred semiconductor device includes an active array of first elements having a first manufacturing precision, a peripheral region surrounding the active array, the peripheral region including second elements having a second manufacturing precision less than the first manufacturing precision, wherein the second elements are isolated from the active array and comprise passive devices, such as decoupling capacitors, for improving operations of the active array, wherein the active array includes an active memory array including bitlines and active wordlines. The second devices comprise capacitors, resistors, diodes, inductors, etc., and the second manufacturing precision is insufficient to use the dummy wordlines as the active wordlines. The second devices could be decoupling capacitors. The second elements may include a power supply, and the active array include trench memory cells, and the active array may include stack memory cells.

Another aspect of the preferred method includes manufacturing a semiconductor device having an active array of first elements having a first manufacturing precision, a peripheral region surrounding the active array, the peripheral region including second elements having a second manufacturing precision less than the first manufacturing precision, wherein the second elements are isolated from the active array and comprise passive devices for improving operations of the active array. The method includes identifying remaining empty space on a semiconductor lithographic pattern, extracting the closes power-supply nets on the semiconductor lithographic pattern, sorting the power-supply nets and their combinations in a connection table, determining appropriate types of decoupling capacitances for respective power-supply nets, and generating lithographic fill patterns for the empty spaces.

A preferred method includes reviewing a cell library; checking residual area planned for building a semiconductor device on the semiconductor structure; and building at least two of the semiconductor device if the area is larger than a recommended value. The semiconductor device may be a deep trench decoupling capacitor. The recommended value may be a recommended maximum trench library size.

A preferred semiconductor structure includes a cell library having edge cells and array cells, whereby the edge cells are used to build a boundary of an irregular fill pattern and array cells can are used to fill the content of the irregular fill pattern. The edge cells may include a first type deep trench fill pattern for maintaining lithographic pattern density. The array cells may include a first type deep trench fill pattern for maintaining lithographic pattern density.

While the invention has been particularly shown and described with reference to a preferred embodiment hereof, it will be understood by those skilled in the art that several changes in form and detail may be made without departing from the spirit and scope of the invention.

What is claimed is:

1. A method for generating lithographic fill patterns in a semiconductor structure, the method comprising the steps of:

reviewing a cell library;

checking residual area planned for building a semiconductor device, represented in the cell library, on the semiconductor structure; and selectively building a plurality of the semiconductor devices depending on whether the residual area is larger than a recommended value.

2. The method of claim 1, wherein the semiconductor device is a deep trench decoupling capacitor.

3. The method of claim 1, wherein the recommended value is a recommended maximum trench library size.

4. A method comprising: performing a partial topographical layout of a semiconductor chip, the partial topographical layout including a plurality of power-supply nets;

identifying an area not occupied by the partial topographical layout;

selecting a power-supply net in the plurality of power supply nets, depending on a spacial relationship between the plurality of power-supply nets and the area; and augmenting the partial topographical layout, by assigning a capacitor to the area and making a connection between the selected power-supply net and the capacitor.

5. The method of claim 4 wherein selecting includes selecting a power-supply net closest to the area.

6. The method of claim 4 wherein identifying includes identifying a plurality of areas not occupied by the partial topographical layout.

7. The method of claim 4 wherein identifying includes identifying a plurality of areas not occupied by the partial topographical layout, the plurality of areas being mutually discontiguous.

8. The method of claim 4 wherein identifying includes identifying a plurality of areas not occupied by the partial topographical layout, and the method further includes assigning respective capacitors to some of the plurality of areas, depending on voltages in of the power-supply nets.

9. The method of claim 8 wherein assigning respective capacitors includes selectively assigning either a deep trench capacitor or plate-type capacitor.

10. The method of claim 4 wherein identifying includes identifying a plurality of areas not occupied by the partial topographical layout, and the method further includes assigning respective types of capacitors to some of the plurality of areas, depending on voltages in of the power-supply nets.

11. The method of claim 4 wherein identifying includes identifying a plurality of areas not occupied by the partial topographical layout, and the method further includes assigning respective capacitors sizes to some of the plurality of areas, depending on voltages in of the power-supply nets.

12. The method of claim 11 wherein assigning respective capacitors includes selectively assigning either a deep trench capacitor or plate-type capacitor.

* * * * *

UNITED STATES PATENT AND TRADEMARK OFFICE
CERTIFICATE OF CORRECTION

PATENT NO.   : 6,232,154 B1
DATED        : May 15, 2001
INVENTOR(S)  : Armin M. Reith It is certified that error appears in the above-identified patent and that said Letters Patent is hereby corrected as shown below:

<u>Title page,</u>
Item [73], add the following assignee -- International Business Machines Corporation of Armonk, New York --

Signed and Sealed this

Twenty-second Day of July, 2003

JAMES E. ROGAN
*Director of the United States Patent and Trademark Office*